United States Patent [19]

Teraishi

[11] Patent Number: 4,537,653
[45] Date of Patent: Aug. 27, 1985

[54] SYNTHESIS OF BERYL CRYSTALS

[75] Inventor: Katsuhiro Teraishi, Suwa, Japan

[73] Assignee: Kabushiki Kaisha Suwa Seikosha, Tokyo, Japan

[21] Appl. No.: 452,488

[22] Filed: Dec. 23, 1982

[30] Foreign Application Priority Data

Dec. 25, 1981 [JP] Japan .................. 56-210438

[51] Int. Cl.$^3$ .............................. C30B 13/02
[52] U.S. Cl. .................... 156/620; 156/DIG. 61; 156/DIG. 73
[58] Field of Search ....... 156/620, 621, 624, DIG. 61, 156/DIG. 73; 423/624

[56] References Cited

U.S. PATENT DOCUMENTS

| | | | |
|---|---|---|---|
| 3,234,135 | 2/1966 | Ballman et al. | 156/624 X |
| 3,341,302 | 9/1967 | Flanigen et al. | 156/624 |
| 3,473,935 | 10/1969 | Wilson et al. | 156/624 X |
| 3,977,857 | 8/1976 | Mattox | 156/242 X |
| 4,093,502 | 6/1978 | Hirabayashi et al. | 156/624 |
| 4,218,282 | 8/1980 | Kochi | 156/620 |
| 4,256,531 | 3/1981 | Kimura et al. | 156/DIG. 63 X |
| 4,340,426 | 7/1982 | Tabei et al. | 75/53 X |

OTHER PUBLICATIONS

Grant; Hackh's Chemical Dictionary: McGraw-Hill 1969, 275.

Primary Examiner—Hiram H. Bernstein
Assistant Examiner—Michael S. Gzybowski
Attorney, Agent, or Firm—Blum Kaplan Friedman Silberman and Beran

[57] ABSTRACT

A method for synthesizing beryl crystals from a raw material substantially that of natural beryl and at least one material of molybdates, vanadates and tungstates to form a flux is provided. The raw material and oxides are melted and a rotating beryl seed crystal is placed in contact with the rotating melt zone and drawn away from melt zone so that beryl crystal is synthesized as the seed crystal is withdrawn from the melt zone. The melt zone may be formed in a zone floating furnace with rotating axes or in a rotating crucible.

15 Claims, 2 Drawing Figures

SYNTHESIS OF BERYL CRYSTALS

BACKGROUND OF THE INVENTION

This invention relates to the synthesis of beryl single crystals, and more particularly to synthesis of beryl single crystals from a raw material having a composition substantially similar to that of natural beryl and including at least one material selected from molybdates, vanadates and tungstates.

The composition of natural beryl crystal is $3BeO \cdot Al_2O_3 \cdot 6SiO_2$ and has a hexagonal crystalline structure. Beryl crystal is an incongruent melting material temperature of about 1410° C. The hydrothermal process and the flux process are the main conventional synthetic processes for synthesizing beryl crystal. Specifically, the flux process has been in practical use and green emerald crystals have appeared on the market wherein chromium element has been doped into the flux.

The production costs in the flux process are extremely high for the following reasons.

1. It is necessary to utilize a platinum crucible.
2. The temperature for synthesis of the beryl crystal must be controlled precisely.
3. Significant amounts of flux must be used.
4. It is difficult to prevent feather inclusion from occuring.
5. The rate of crystal growth is slow.

Accordingly, it is desirable to provide a more economical process for preparing beryl crystals than the foregoing flux process. One such improvement is the use of a F.Z furnace in a zone floating method described by Akihiko Kochi in U.S. Pat. No. 4,218,282 which issued on Aug. 19, 1980 and assigned to the same assignee. In this process single crystals of chrysoberyl and beryl are prepared from feed rods formed of a desired composition wherein the feed rods are heated at one focus of a total ellipsoid mirror by a lamp positioned at the other focus of the ellipsoid mirror. The feed rod is held from above and below by axes rotating in opposite directions with the feed rod supported in a sealed, transparent quartz tube so that the atmosphere surrounding the feed rod can be controlled. A melt zone is formed in the feed rod and displaced along the rod by moving the rotation axis vertically. While this improvement has been satisfactory, it is desirable to improve further the synthesis of beryl crystals.

In any improved process it is desirable to have the following characteristics.

1. Avoid use of a platinum crucible.
2. Reduced the amounts of flux used.
3. Control feather inclusion by a controlled parameter not present in the conventional flux process.
4. A rate of crystal growth relatively high compared to the flux process.
5. Control direction of crystal growth to increase efficiency of production.

SUMMARY OF THE INVENTION

Generally speaking, in accordance with the invention, an improved process for synthesizing beryl crystals from a melt zone wherein at least one of molybdates, vanadates or tungstates is added to the raw material in the zone is provided. A raw material consisting of beryllium oxide, aluminum oxide, silicon oxide and chromium oxide having a composition substantially similar to that of natural beryl, $3BeO \cdot Al_2O_3 \cdot 6SiO_2 \cdot 0.005Cr_2O_3$ is admixed with at least one of the molybdates, vanadates or tungstates to form a flux material.

In a first embodiment of the invention, the raw material having a composition substantially similar to that of natural beryl is mixed and sintered in a pot mill to form a feed rod. A flux is prepared by including at least one molybdate, vanadate or tungstate to the raw material powder. A sintered flux pellet is formed by sintering and molding the mixed flux powder. A beryl crystal synthesized by the flux process is cut in the direction of the c-axis and processed to size for use as a seed crystal. The flux pellet is positioned on the seed crystal on one rotating axis of a zone floating apparatus and the feed rod is positioned directly on the flux pellet to contact with it and is rotated in the opposite direction by the other axis. The flux is melted by increasing the temperature of the rod while maintaining the melted flux zone at about 1100° C. The upper and lower rotation axis are moved vertically to maintain the length of the melt zone between the seed crystal and the feed rod. The moving speed corresponds directly to the rate of crystal growth.

In a second embodiment of the invention, beryl crystal may be synthesized using a crucible. In this embodiment the flux composition is melted in a crucible and a beryl seed crystal is fixed to a rotation axis and contacted to the melted flux. The rotation axis is maintained at a rotation speed between 1 to 200 r.p.m. with the crucible rotated at the same speed in the opposite direction. The rotation axis is withdrawn from the surface of the melt at a fixed speed between about 0.05 mm to 0.5 mm per day for synthesizing the beryl crystal.

Accordingly, it is an object of the invention to provide for the improved synthesis of beryl crystals.

It is another object of the invention to provide for the synthesis of beryl crystals without utilizing a platinum crucible.

It is further object of the invention to provide an improved method of synthesizing beryl crystals using reduced amounts of flux.

Still another object of the invention is to provide an improved method of synthesizing beryl crystals which avoid feather inclusion from occuring.

Still a further object of the invention is to provide an improved method of synthesizing beryl crystals wherein the direction of crystal growth can be controlled.

Yet another object of the invention is to provide an improved method of synthesizing beryl crystals wherein the rate of crystal growth is relatively high compared to the flux process.

A further object of the invention is to provide an improved method of synthesizing beryl crystals utilizing the zone floating method.

A further object of the invention is to provide an improved method of synthesizing beryl crystals utilizing a rotating crucible and rotating axis having a beryl seed crystal fixed thereon.

Still other objects and advantages of the invention will in part be obvious and will in part be apparent from the specification.

The invention accordingly comprises the several steps and the relation of one or more of such steps with respect to each of the others thereof, which will be exemplified in the method hereinafter disclosed and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
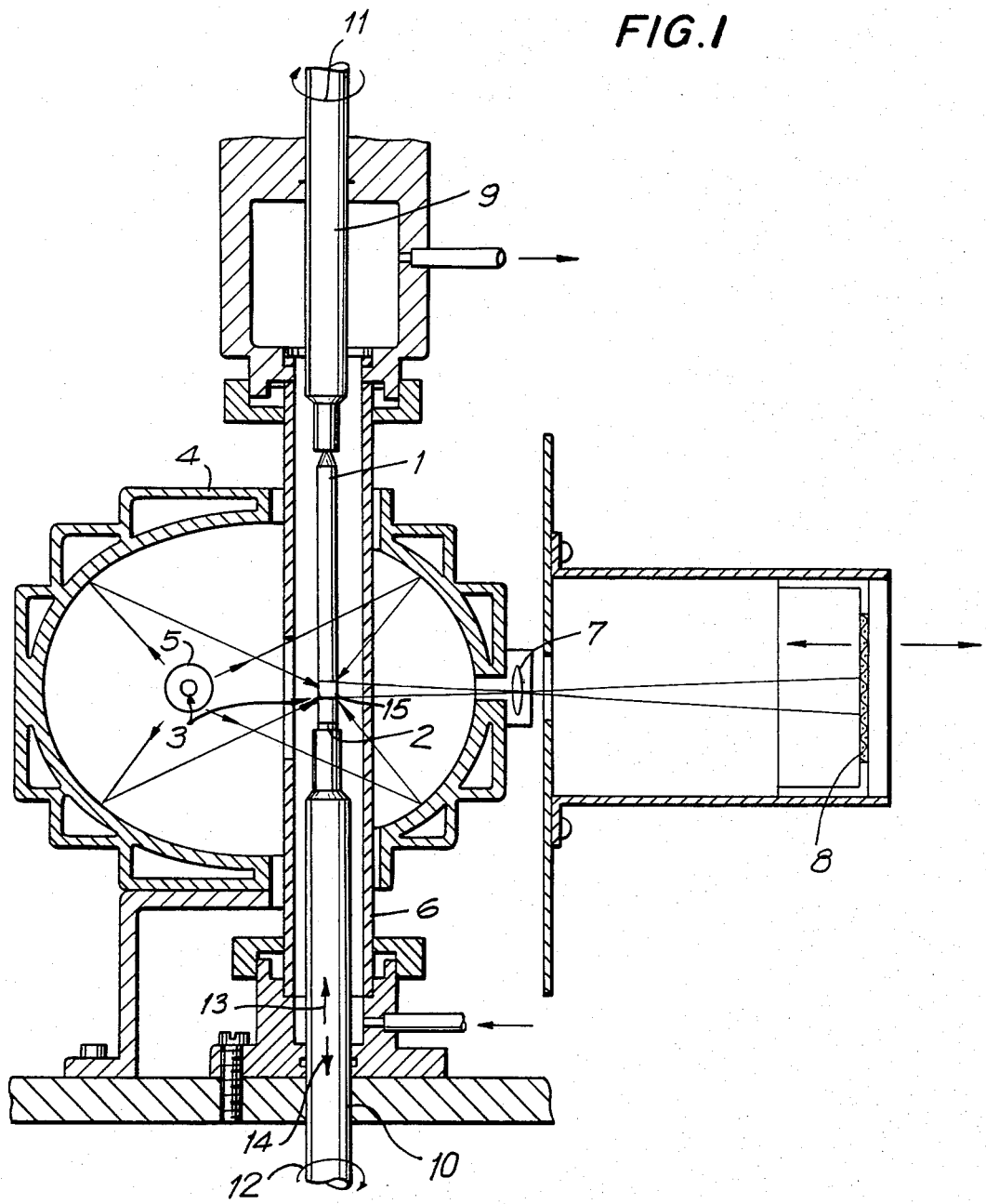
FIG. 1 is a cross-sectional view illustrating a zone floating furnace for synthesizing beryl crystals in accordance with the invention.

Referring to FIG. 1, a zone floating furnace (hereinafter "F.Z furnace") for synthesizing beryl single crystals in accordance with the invention is shown. The F.Z furnace illustrated is available as Model SC-2 of Nichiden Kiakai Co., Ltd. of Japan. The F.Z furnace includes a total ellipsoidal mirror 4 equipped with a vertically disposed transparent quartz tube 6 passing through one focus 3 of mirror 4. The furnace also includes an upper rotation axis 9 within quartz tube 6 for rotating in a first direction illustrated by an arrow 11 and a cooperating lower rotating axis 10 which rotates in a second opposite direction indicated by an arrow 12. A feed rod 1 is supported by upper rotation axis 9 and a seed crystal 2 is fixed to lower rotation axis 10. Rotation axes 9 and 10 are disposed within transparent quartz tube 6 to permit control of the atmosphere wherein the crystal is to be formed. A halogen lamp 5 which is the heat source for the F.Z furnace is disposed at the other focal point 3. A flux pellet 15 is disposed in a melt zone at the other focal point 3 between feed rod 1 and seed crystal 2.

A lens 7 is disposed adjacent to quartz tube 6 with a screen 8 spaced apart from lens 7 for monitoring the synthesis of the crystal at the melt zone at focal point 3. Upper rotation axis 9 and lower rotation axis 10 are displaceable in an upward or downward direction as indicated by arrows 13 and 14, respectively for displacing the melt zone along feed rod 1 and maintaining the length of the melt zone.

The following examples illustrates synthesis of beryl single crystals in accordance with the invention. Examples 1–8 utilize the F.Z furnace illustrated in FIG. 1. The examples herein are presented by way of illustration, and not intended in a limiting sense.

EXAMPLE 1

A raw material mix of pure materials was prepared from beryllium oxide power (BeO), aluminum oxide powder ($Al_2O_3$), silicon dioxide powder ($SiO_2$) and chromium oxide powder ($Cr_2O_3$). The materials were mixed so that the composition of the mixed powder of raw material was $3BeO.Al_2O_3.6SiO_2.0.005Cr_2O_3$. The prepared powder was mixed and ground in a pot mill for more than 50 hours. The pot and the bowl were of a sintering material of high purity alumina. The mix was formed into a sintering rod by conventional manufacturing methods for forming feed rods for use in a F.Z furnace method. This become feed rod 1 for the F.Z furnace of FIG. 1.

Pure lithium hydroxide (LiOH) and vanadium pentoxide ($V_2O_5$) was mixed to form a composition $Li_2O.V_2O_5$. 20 weight percent of raw material material having a composition $3BeO.Al_2O_3.6SiO_2.0.005Cr_2O_3$ was added to the prepared $Li_2O.V_2O_5$ powder to form a flux. A sintered flux pellet was formed by sintering and molding the mixed powder. A beryl seed crystal synthesized by the conventional flux process was cut is the direction of the c-axis and cut to size for use as seed crystal 2.

The materials prepared were positioned in the F.Z furnace as described above for synthesizing the beryl crystals. First, the flux pellet was positioned on seed crystal 2 and feed rod 1 was positioned directly on the flux pellet to contact it. The flux was melted by increasing the electric power to the halogen lamp to maintain the flux between seed crystal 2 and feed rod 1 by surface tension.

Upper and lower axis 9 and 10 were rotated in opposite directions at a speed of 50 r.p.m. while maintaining the melted flux zone at 1100° C. for 10 hours. After that upper and lower rotation axes 9 and 10 were displaced downwardly maintaining the distance between seed crystal 2 and feed rod 1, specifically, the distance of the melt zone. In this case, the speed of displacement corresponded to the rate of crystal growth.

The rate of crystal growth in accordance with the invention must be controlled because feather inclusion occurs if the rate is too high. In accordance with this embodiment of the invention, the maximum achievable rate is about 1 mm per day. When the rate of crystal growth is less than this, it is possible to synthesize the crystal without inclusion. Additionally, as the rate becomes slower the crystal grows more efficiently as the conditions for controlling other growth conditions increases.

Beryl crystals synthesized in accordance with the invention grow on the interface between the melt zone and seed crystal 2. Thus, when synthesis is concluded, a crystal in the lower portion between the upper rotation axis 9 and lower rotation axis 10 can be utilized directly as an emerald crystal after cutting away the upper flux solid. Additional treatment is unnecessary. In this way, an emerald crystal without inclusion may be made synthetically at a rate of between 0.01 to 0.5 mm per day. The diameter of the crystal formed was between about 5 to 10 mm.

EXAMPLE 2

The procedures of Example 1 were followed except that synthesis was performed by inverting the positions of feed rod 1 and seed crystal 2 in the F.Z furnace of FIG. 1. Accordingly, the melt was maintained on the upper portion of feed rod 1 which was positioned on the lower portion by surface tension. At this time seed crystal 2 was maintained in the upper portion of the furnace not in contact with the melt while maintaining the melted flux zone at 1100° C. After 10 hours, seed crystal 2 was brought into contact with the melt zone to grow the beryl crystal.

Following the procedures of this Example 2, it was easy to control the saturated solubility of the melt zone and it was possible to start the crystal both immediately after contacting seed crystal 2 with the melt. The quality of the crystal is also high. Inclusion was not found here or in crystals of Example 1 when observing the crystal under a jewel stone microscope of 80 power.

EXAMPLE 3

The procedures of Example 1 were followed and the beryl crystal was synthesized under the same conditions wherein the molar ratio of the $V_2O_5/Li_2O$ of the flux pellet was varied over a range of between 1 and 5. In each case emerald crystal was synthesized without inclusion.

EXAMPLE 4

The procedures of Example 1 were followed utilizing the same conditions for synthesis of the beryl crystal. The temperature of crystal growth was varied, namely the temperature of the melt zone. The temperature of the melt zone is maintained by changing the electric power of the halogen lamp. When the rate of crystal growth was 0.5 mm/day, it was possible to synthesize the beryl crystal without inclusion while maintaining the temperature between about 950° to 1200° C.

EXAMPLE 5

Following the procedures of Example 1, beryl crystal was synthesized utilizing $Li_2O$-$MoO_3$ as a flux pellet. It was found that the rate of crystal growth may be maintained between 0.01–0.2 mm per day at a temperature of between about 750° to 950° C. when the molar ratio of $MoO_3/Li_2O$ is between 3 and 5.

EXAMPLE 6

Following the procedures of Example 1, beryl crystal was synthesized using $Li_2O$-$WO_3$ as a flux pellet. It was found that the rate of crystal growth may be maintained between 0.01–0.2 mm per day at a temperature of between about 800° to 100° C. when the molar ratio of $WO_3/Li_2O$ is between 2 and 6.

EXAMPLE 7

Following the procedures of Example 1, beryl crystal was synthesized to determine the correlation between the crystalographic direction of the seed crystal and reliability of crystal growth quality. Emeralds have a hexagonal system. In Example 1, the crystal is made to grow in the direction in the c-axis, namely in the direction of (0001). The other characteristic direction of crystal growth is the direction of the a-axis, namely the direction of ($2\bar{1}\bar{1}0$). Further, facets a and c are typically natural. In this experiment, the seed crystal was cut every 10° between the (0001) and ($2\bar{1}\bar{1}0$) directions and each crystal was formed following the following procedures.

The speed of rotation of the upper and lower axes in opposite directions was 50 r.p.m. The rate of crystal growth was maintained at 0.3 mm per day. As a result, it was determined that formation of crystal without inclusion was more successful where the crystal was formed on the face incline between 2° to 10° from the basal index face [for example, the faces (0001), ($2\bar{1}\bar{1}0$)]. Consequently it was possible to increase the rate of crystal growth to 2 mm per day as a maximum without inclusion. This was truly a remarkable effect.

As described above in Examples 1–7, this invention provides a new method and very useful method for synthesizing beryl crystals by improving the conventional "F.Z method". Specifically, the method in accordance with the invention is an extremely useful technique for manufacturing crystals without inclusion at higher rates of crystallization than conventionally possible. This is done by utilizing the chemical additive to the flux material together with adjusting the crystal direction of the seed crystal.

It has also been found that by adding less than 2 percent by weight boron oxide ($B_2O_3$) or less than 3 percent by weight of phosphorus pentoxide ($P_2O_5$) to the flux composition insures against formation of inclusion in the crystals. The same effect can be obtained if both additional additives are included.

EXAMPLE 8

This example was performed following the procedures of Example 1 in order to determine the results of doping the feed rod with additional additives. In order to increase the doping effect, it was necessary to increase the speed of crystal growth, but stay within the range where inclusion can be avoided. Accordingly, the conditions of Example 7 were selected with the face of the seed crystal rotated 5 degrees from the ($11\bar{2}1$) cut on the upper part of that face. The rate of crystal growth was 0.5 mm per day.

Additives, such as iron oxide ($FeO_3$), zirconium oxide ($ZrO_2$), titanium dioxide ($TiO_2$), calcium oxide (CaO) and cerium oxide ($CeO_2$) were added in the same amounts when preparing the flux powder. It was necessary to limit the maximum quantity of the additives to 3 percent by weight in order to avoid inclusion, as inclusion occurs within the crystal if the oxides are present in amounts greater than 3 percent by weight.

The synthetic crystal is heated in an electric furnace maintaining the temperature at less than 1400° C. This upper temperature limit is due to the fact that the decomposition temperature of emerald is 1410° C. It is necessary to maintain the temperature for a longer time if the temperature is lower. For example, is the temperature is maintained at 1350° C. it takes about 50 hours. If the temperature is 1000° C. is takes more than 500 hours. By this heat treatment, a reaction between the added elements and the synthetic crystal takes place so that the crystal becomes semi-transparent. However, the occurance of inclusion in this case has a crystal anisotropy, which results in extremely useful effects, such as an asterism effect or "a cat's-eye effect" in gem parlance. These effects have a high decorative value.

Figure 2:
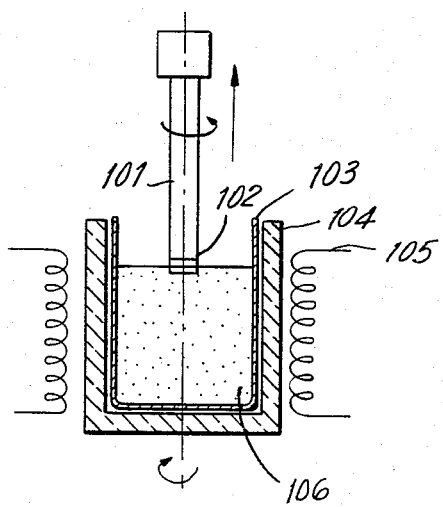
FIG. 2 is a cross-sectional view of a rotating crucible apparatus utilized in accordance with another embodiment of the invention for synthesizing beryl crystals.

The above Examples 1–8 utilize the F.Z furnace. It is also possible to synthesize beryl crystals in accordance with the invention utilizing a crucible. FIG. 2 illustrates the apparatus in accordance with this embodiment of the invention.

A beryl seed crystal 102 is fixed to a rotation axis 101 by a chuck and is soaked in a flux material in a crucible 103 which has been heated to a fixed temperature between 750° C. and 1200° C. by an internal heater 104 and an external heater 105. Rotation axis 101 is then rotated at a fixed speed of rotation between 1 r.p.m. and 200 r.p.m. at the same time crucible 103 is rotated in an opposite direction as rotation axis 101 and at the same speed as rotation axis 101. After contacting the melt, rotation axis 101 is withdrawn at a fix speed between 0.05 mm to 0.5 mm per day.

Synthesis of beryl crystals in accordance with this embodiment of the invention has the following advantages.

1. Seed beryl crystal 102 and crucible 103 rotate so that raw material 106 is equally distributed about the surface of seed beryl crystal 102.

2. Seed beryl crystal 102 is connected to rotation axis 101 and heat is conducted from the surface of seed beryl crystal 102 to rotation axis 101. When the surface of beryl crystal 102 is cooled and the temperature of raw material 106 becomes different from that of beryl crystal 102 crystal growth results. Therefore, it is not necessary to control the temperature critically.

3. It is possible to form and observe beryl crystal by drawing rotation axis 101 to which seed beryl crystal 102 if fixed.

EXAMPLE 9

1. A raw material having the following composition was prepared:

| Material | Amount |
|---|---|
| Beryl powder | 10 g |
| $Li_2MoO_4$ | 150 g |
| $MoO_3$ | 150 g |
| $Cr_2O_3$ | 0.2 g |

2. Temperature conditions for forming flux.

The materials of 1 were placed in a platinum crucible and maintained at a temperature of 900° C. for 10 hours.

3. Addition of beryl and rotation.

A beryl crystal was soaked in the flux and maintained for 24 hours while rotating the beryl in one direction and the crucible in an opposite direction at 50 r.p.m.

4. Drawing up conditions.

After keeping the beryl in flux for 24 hours, the beryl was drawn up at a rate of 0.2 mm per day for 30 days. Synthetic emerald crystals were obtained by elute treatment with hot water.

5. Results.

An emerald single crystal having a diameter 1.5 times as long as the diameter of the seed beryl with a length of 5 mm. The refractive index was 1.564–1.561 and had a specific gravity of 2.64. There were no inclusion in the crystal.

EXAMPLE 10

1. Raw material.

| Material | Amount |
|---|---|
| beryl powder | 10 g |
| $V_2O_5$ | 100 g |
| LiOH | 20 g |
| $Cr_2O_5$ | 0.2 g |

2. Temperature conditions for forming flux.
Followed Example 9.

3. Addition of beryl and rotation.

The beryl was soaked in the flux for 10 hours while rotating the beryl and crucible at 1 r.p.m.

4. The conditions for drawing up.

After maintaining the beryl in the flux for 10 hours, the beryl was drawn up at a rate of 0.05 mm per day for 10 days. Synthetic emerald crystals were obtained by elute treatment with heated nitric acid.

5. Results.

An emerald single crystal having a diameter 2 times as long as the diameter of the seed beryl crystal with a length of about 1 mm. The refractive index was 1.568–1.563 and a specific gravity of 2.65.

EXAMPLE 11

1. Raw Material.
The same as Example 9.

2. Temperature conditions for forming flux.

The materials of 1 were placed in a platinum crucible at 750° C. for 10 hours.

3. Addition of beryl and rotation.
Same as Example 10.

4. The conditions for drawing up are the same as Example 10.

5. Result.

An emerald single crystal having a diameter 1.3 times as long as the diameter of the seed beryl and the length of 0.7 mm. The refractive index was 1.564–1.561 and the specific gravity was 2.64.

EXAMPLE 12

1. Raw material.
The same as Example 9.

2. Temperature conditions for forming flux.

The materials of 1 were placed in a platinum crucible and maintained at 1200° C. for 5 hours.

3. Addition of beryl and rotation.

The beryl crystal was soaked in the molten flux for 24 hours while rotating the beryl and crucible at opposite directions at a speed of 200 r.p.m.

4. The conditions for drawing up.

After maintaining the beryl in the flux, the beryl is drawn up at a rate of 0.5 mm per day for 10 days. Synthetic emerald crystals were obtained by elute treatment with hot water.

5. Results.

An emerald single crystal which did not grow much in the radial direction. The length was 5 mm with a refractive index of 1.564–1.561 and specific gravity of 2.64.

Many modifications and variations of the synthesis of beryl crystals in accordance with the invention are possible by selecting different rotational speeds and drawing up of beryl or the temperature. As indicated in the description above and the Examples, the invention includes synthesizing beryl single crystal by utilizing conventional flux method with a simple Czochralski method contributes to qualitative improvements. There is an increase in yield and a decrease in cost without loosing the essential advantages of the conventional flux method. Accordingly, the invention is extremely significant as a method of synthesizing beryl single crystal.

It will thus be seen that the objects set forth above, among those made apparent from the preceeding description, are efficiently attained and, since certain changes may be made in carrying out the above process without departing from the spirit and scope of the invention, it is intended that all matter contained in the above description shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A method of synthesizing beryl single crystals in a zone floating apparatus, comprising:
   forming a raw material powder by mixing beryllium oxide (BeO), aluminum oxide ($Al_2O_3$), silicon dioxide ($SiO_2$) and chromium oxide ($Cr_2O_3$) in a molar ratio substantially that of natural beryl, said raw material having the composition, $3BeO.Al_2O_3.6SiO_2.0.005Cr_2O_3$;
   sintering the raw material powder and forming a feed rod;

mounting the feed rod on a first rotating axis and rotating the feed rod in a first rotational direction;

forming a flux pellet of raw material powder including at least one material selected from the group consisting of molybdates, vanadates and tungstates;

placing the flux pellet on the free end of the feed rod;

forming a melt zone in the free end of said rotating feed rod;

mounting a seed crystal on a second rotational axis and rotating said axis in a direction opposite to the first rotation direction;

contacting the rotating seed crystal with the melt zone including the flux pellet;

moving the melt zone along the feed rod so that beryl crystal is synthesized as the melt zone is displaced along the feed rod; and heating said synthetic crystal at a temperature of between about 1000°–1410° C. for about 50 to 500 hours.

2. The method of synthesizing beryl single crystals of claim 1, wherein the melted flux zone is maintained at temperatures between about 800° and 1200° C.

3. The method of synthesizing beryl single crystals of claim 1, wherein each of the feed rod and seed crystal are rotated at a fixed speed between about 1 and 50 r.p.m. in opposite directions.

4. The method of synthesizing beryl signal crystals of claim 1, wherein the flux pellet includes $Li_2O$ and $MoO_3$.

5. The method of synthesizing beryl single crystals of claim 1, wherein the flux pellet includes $Li_2O$ and $WO_3$.

6. The method of synthesizing beryl single crystals of claim 1, wherein the flux pellet is formed of lithium hydroxide (LiOH) and vanadium pentoxide ($V_2O_5$) to provide a composition $Li_2O.V_2O_5$ admixed with raw material powder of $3BeO.Al_2O_3.6SiO_2.0.005Cr_2O_3$.

7. The method of synthesizing beryl single crystals of claim 6, wherein the flux pellet comprises about 20 percent by weight of $3BeO.Al_2O_3.6SiO_2.0.005Cr_2O_3$ raw material and the remainder being $Li_2O_3.V_2O_5$.

8. The method of synthesizing beryl single crystals of claim 1, wherein the flux pellet comprises $V_2O_5$ and $Li_2O$.

9. The method of synthesizing beryl single crystals of claim 8, wherein the molar ratio of $V_2O_5/Li_2O$ is between 1 and 5.

10. The method of synthesizing beryl single crystals of claim 1, wherein the flux powder includes phosphorus pentoxide ($P_2O_5$).

11. The method of synthesizing beryl single crystals of claim 10, wherein the phosphorus pentoxide is present in an amount up to about 3 weight percent.

12. The method of synthesizing beryl single crystals of claim 1, wherein the flux powder further includes boron oxide ($B_2O_3$).

13. The method of synthesizing beryl single crystals of claim 12, wherein the boron oxide is present in an amount up to about 2 weight percent.

14. The method of synthesizing beryl single crystals of claim 1, further including the step of doping the feed rod with an additive selected from the group consisting of iron oxide ($FeO_3$), zirconium oxide ($ZrO_2$), titanium dioxide ($TiO_2$), calcium oxide (CaO), cerium oxide ($CeO_2$), and mixtures thereof.

15. The method of synthesizing beryl single crystals of claim 14, including the further step of heating the synthetic crystal to a temperature below the decomposition temperature for emerald in the air for an extended period until the crystal becomes semi-transparent.

* * * * *